(12) United States Patent
Di et al.

(10) Patent No.: US 11,650,268 B2
(45) Date of Patent: May 16, 2023

(54) ALL-BAND MAGNETIC SENSOR

(71) Applicant: INSTITUTE OF GEOLOGY AND GEOPHYSICS, THE CHINESE ACADEMY OF SCIENCES, Beijing (CN)

(72) Inventors: Qingyun Di, Beijing (CN); Qihui Zhen, Beijing (CN); Tianxin Zhang, Beijing (CN); Yuliang Wang, Beijing (CN); Zhiyao Liu, Beijing (CN); Quanmin Yang, Beijing (CN)

(73) Assignee: INSTITUTE OF GEOLOGY AND GEOPHYSICS, THE CHINESE ACADEMY OF SCIENCES, Beijing (CN)

( * ) Notice: Subject to any disclaimer, the term of this patent is extended or adjusted under 35 U.S.C. 154(b) by 226 days.

(21) Appl. No.: 17/109,159

(22) Filed: Dec. 2, 2020

(65) Prior Publication Data

US 2021/0088604 A1 Mar. 25, 2021

Related U.S. Application Data

(63) Continuation of application No. PCT/CN2019/073273, filed on Jan. 26, 2019.

(30) Foreign Application Priority Data

Nov. 30, 2018 (CN) .......................... 201811457089.9

(51) Int. Cl.
*G01R 33/02* (2006.01)
*G01V 3/10* (2006.01)
*H01F 27/28* (2006.01)

(52) U.S. Cl.
CPC ................ *G01R 33/02* (2013.01); *G01V 3/10* (2013.01); *H01F 27/28* (2013.01)

(58) Field of Classification Search
None
See application file for complete search history.

(56) References Cited

U.S. PATENT DOCUMENTS

2017/0176547 A1 6/2017 Honkura

FOREIGN PATENT DOCUMENTS

| CN | 1084005 A | 3/1994 |
|---|---|---|
| CN | 207151651 U | 3/2013 |

(Continued)

OTHER PUBLICATIONS

English Translation of CN 207181651 to Chen (Year: 2018).*

(Continued)

*Primary Examiner* — Douglas X Rodriguez

(57) ABSTRACT

An all-band magnetic sensor is provided. The all-band magnetic sensor comprises an induction coil, a voltage measurement module, and an integrator; the induction coil is used for generating an induced electromotive force according to magnetic flux passing therethrough; an impedance transformation circuit is connected to the output end of the induction coil and used for improving the loop resistance of the induction coil; the voltage measurement module is electrically connected to the impedance transformation circuit, and used for measuring the induced electromotive force generated by the induction coil; and the integrator is electrically connected to the voltage measurement module, and used for expanding a bandwidth.

7 Claims, 3 Drawing Sheets

(56) References Cited

FOREIGN PATENT DOCUMENTS

| CN | 104345195 A |   | 2/2015 |
|----|-------------|---|--------|
| CN | 207181651 U | * | 4/2018 |
| CN | 207181651 U |   | 4/2018 |

OTHER PUBLICATIONS

International Search Report issued in corresponding International application No. PCT/CN2019/073273, dated Sep. 5, 2019.
Written Opinion of the International Searching Authority for No. PCT/CN2019/073273.
First Office Action from China patent office in a counterpart Chinese patent Application 201811457089.9, dated Jul. 1, 2019(8 pages).

* cited by examiner

ALL-BAND MAGNETIC SENSOR

CROSS-REFERENCE TO RELATED APPLICATIONS

The present application is a continuation-application of International (PCT) Patent Application No. PCT/CN2019/073273 filed on Jan. 26, 2019, which claims a foreign priority of Chinese Patent Application No. 201811457089.9, with the title of "ALL-BAND MAGNETIC SENSOR", filed on Nov. 30, 2018 in China National Intellectual Property Administration, the entire contents of which are hereby incorporated by reference.

TECHNICAL FIELD

The present disclosure relates to the technical field of exploration geophysics, and in particular, to an all-band magnetic sensor.

BACKGROUND

Inductive magnetic sensors (hereinafter referred to as magnetic sensors) are devices which indirectly measure magnetic fields through output voltages of induction coils based on Faraday's law of electromagnetic induction and using the relationship that an output voltage of a coil is in proportion to a change amount of magnetic flux passing through the coil.

A frequency band measured by exploration adopting an electromagnetism method is very wide, its periods is ranged from 0.001 Hz to 10 kHz. Since quality factors of coils are usually high and result in that it is difficult to expand the band width, almost all prior arts use magnetic flux negative feedback manners to expand measurement band widths. FIG. 1 is a circuitry structural schematic view of inductive magnetic sensor magnetic flux negative feedback technology shown according to an exemplary embodiment, wherein, B is a measured external magnetic field; $C_p$ is a parasitic capacitance of an induction coil; $L_p$ is an inductance of the induction coil; $R_p$ is a resistance of the induction coil; $L_s$ is an inductance of a feedback coil; $R_s$ is a resistance of the feedback coil; $R_{fb}$ is a feedback resistance; M is a mutual inductance between the feedback coil and the induction coil; $N_p$ and $N_s$ are respectively the numbers of turns of the induction coil and the feedback coil; A is an amplification factor of an amplifier circuit; $V_{out}$ is an output of the amplifier circuit; and e is an induction electromotive force of the induction coil.

According to the circuit model of FIG. 1, a conversion function of a magnetic sensor can be obtained as:

$$\frac{V_{out}}{B} = \frac{-j\omega\mu_a N_p SA}{1 + j\omega CR_p - \omega^2 L_p C + \frac{j\omega MA}{R_{fb}}} \quad (1)$$

Wherein, $\mu_a$ is an effective magnetic conductivity, S is an effective cross-sectional area of a magnetic path.

However, since a coil's resistance is small and quality factor is high, although a magnetic flux negative feedback solution is used, expansion of its band width is very limited. It is usually required to reduce a resonance frequency of the coil by connecting a capacitor in parallel at an input end, and then expand the frequency band width by means of magnetic flux negative feedback. However, even though the measurement frequency band is expanded by technologies such as incorporating the capacitor at the input end, reducing the resonance frequency of the coil, and using magnetic flux negative feedback, the frequency band expansion still cannot reach a low frequency, it is unable to obtain a sufficient amplification factor, resulting in that measurement for a magnetic field at a low frequency is still very difficult. Additionally, the solution using magnetic flux negative feedback results in very large power of sensors, which is not very suitable for requirements of long-time fieldwork. In particular, magnetic fields at tens of hertz or more is much larger than magnetic fields at 1 hertz or less, which results in that it is difficult to obtain information of magnetic fields at 1 hertz or less although magnetic sensors consume very large power. Since the band width cannot be extended to be lower than 1 Hz, it is caused that signals of low-frequency magnetic fields are very low and signals of high-frequency magnetic fields are very strong, a signal conditioning circuit is unable to perform effective amplification for low-frequency signals, signal-to-noise ratios of the low-frequency signals are very low, and it is unable to really obtain reliable and high-quality data of low-frequency magnetic fields.

SUMMARY

A purpose of the present disclosure is to provide an all-band magnetic sensor, which is intended to solve the technical problem in the prior art that it is difficult to extend a measurement bandwidth of a magnetic sensor to an ultralow frequency of 0.001 Hz.

The present disclosure provides an all-band magnetic sensor, comprising:

an induction coil configured to generate an induced electromotive force according to magnetic flux passing therethrough;

a voltage measurement module electrically connected to the induction coil and configured to measure the induced electromotive force generated by the induction coil; and an integrator electrically connected to the voltage measurement module and configured to expand a bandwidth.

Preferably, the voltage measurement module comprises a differential amplifier, a forward input end and an inverting input end of the differential amplifier are respectively connected to two output ends of the induction coil.

Preferably, the integrator comprises a third operational amplifier, a first resistor, and a third capacitor; one end of the first resistor is connected to the voltage measurement module, another end of the first resistor is connected to a forward input end of the third operation amplifier, an inverting input end of the third operation amplifier is grounded, and the forward input end of the third operation amplifier is connected to an output end of the third operational amplifier through the third capacitor.

Preferably, the third operational amplifier is an operational amplifier having a low-noise performance.

Preferably, the all-band magnetic sensor further comprises an impedance transformation circuit, the impedance transformation circuit is connected to the output end of the induction coil and configured to improve a loop resistance of the induction coil.

Preferably, the impedance transformation circuit comprises a second resistor, a second capacitor, a fourth capacitor, and a first operational amplifier; the induction coil comprises a first output end and a second output end, the first output end is connected in series with the fourth capacitor through the second resistor and is then connected to the second output end, and the first output end is connected to an inverting input end of the first operational amplifier; the second output end is connected to the ground; a connection node between the second resistor and the fourth capacitor is connected to an output end of the first operational amplifier through the second capacitor, an inverting input end of the first operational amplifier is connected to the output end, and a forward input end of the first operational amplifier is connected to one of the output ends of the induction coil; the voltage measurement module is connected to the first output end.

Preferably, the differential amplifier of the voltage measurement module comprises a forward input end and an inverting input end, the forward input end of the differential amplifier is connected to the first output end, and the connection node between the second resistor and the fourth capacitor is connected to the inverting input end.

Preferably, the second resistor is identical to the first resistor of the integrator, and the fourth capacitor is identical to the third capacitor of the integrator.

In the all-band magnetic sensor disclosed by the present disclosure, after detecting the induced electromotive force generated by the induction coil through the voltage measurement module, the adopted integrator has characteristics of a big low-frequency magnification and a small high-frequency magnification, so that expansion of a measurement bandwidth is realized, a measurement bandwidth of the magnetic sensor is extended to an ultralow frequency of 0.001 Hz, and all-band measurement is realized on the condition of no magnetic flux negative feedback.

BRIEF DESCRIPTION OF THE DRAWINGS

In order to describe technical solutions of embodiments of the present disclosure or of the prior art more clearly, drawings required being used in description of the embodiments or of the prior art will be simply introduced below. Obviously, the drawings in the following description are merely some embodiments of the present disclosure. For one of ordinary skill in the art, it is also possible to obtain other drawings according to these drawings without paying any creative work.

Figure 1:
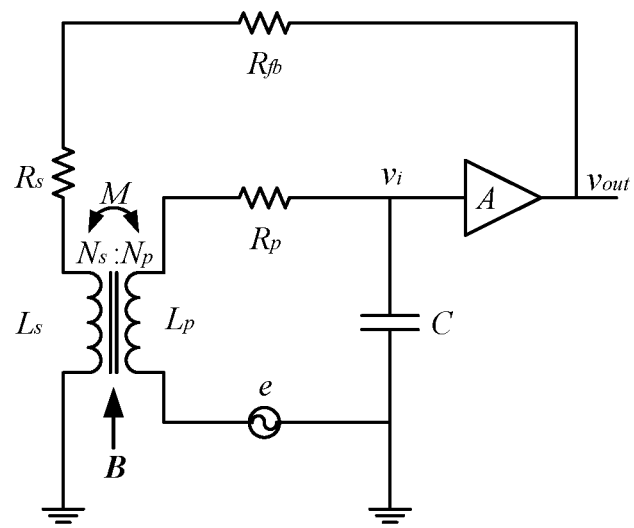
FIG. 1 is a circuitry structural schematic view of inductive magnetic sensor magnetic flux negative feedback technology shown according to an exemplary embodiment.

The drawing numerals in the drawings are represented as follows:

first operational amplifier $A_1$; differential amplifier $A_2$; third operational amplifier $A_3$; second capacitor $C_2$; third capacitor $C_3$; fourth capacitor $C_4$; first resistor $R_1$; second resistor $R_2$.

DETAILED DESCRIPTION

In order to make the objects, technical solutions and advantages of the present disclosure be clearer, the present disclosure will be further described in detail below with reference to the accompanying drawings and embodiments. It should be understood that the specific embodiments described herein are merely intended to illustrate the present disclosure and are not intended to limit the present disclosure.

Specific implementation of the present disclosure is described in detail below in accompany with specific embodiments.

Embodiment I

Figure 3:
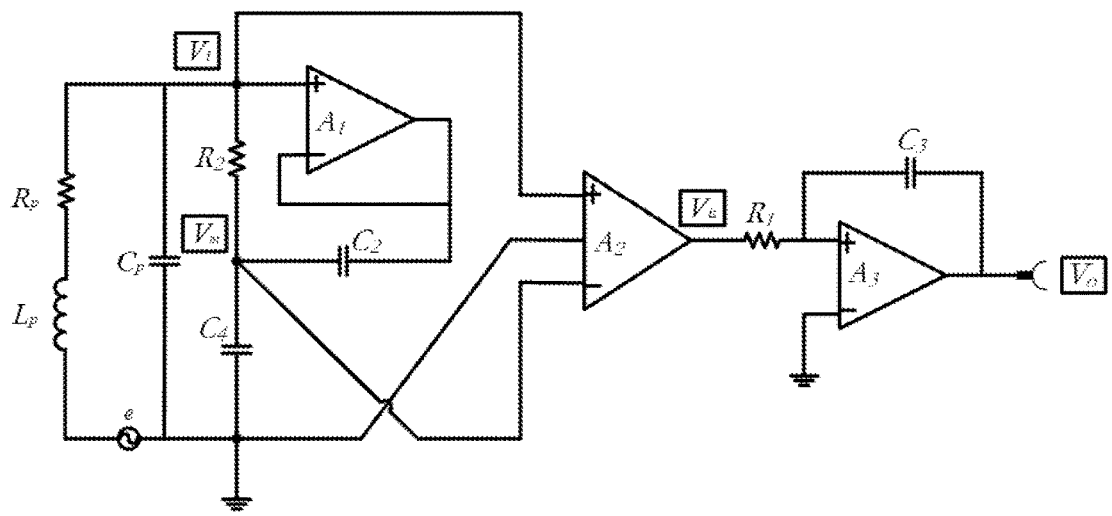
FIG. 3 is an equivalent measurement circuit diagram of the circuit shown in FIG. 2.

As shown in FIG. 3, an all-band magnetic sensor provided by this embodiment comprises an induction coil, an impedance transformation circuit, a voltage measurement module, and an integrator connected in sequence.

The induction coil is used for generating an induced electromotive force according to magnetic flux passing therethrough.

The impedance transformation circuit is connected to an output end of the induction coil and configured to improve a loop resistance of the induction coil, reduce a value of a quality factor Q of a corresponding signal, so that an amplitude characteristic at a resonance frequency point is suppressed, and a signal-to-noise ratio of a measurement signal is improved.

The voltage measurement module is electrically connected to the impedance transformation circuit, and configured to measure the induced electromotive force generated by the induction coil.

The integrator is electrically connected to the voltage measurement module, and configured to expand a bandwidth.

Specifically, the impedance transformation circuit comprises a second resistor $R_2$, a second capacitor $C_2$, a fourth capacitor $C_4$, and a first operational amplifier $A_1$; the induction coil comprises a first output end and a second output end, the first output end is connected in series with the fourth capacitor $C_4$ through the second resistor $R_2$ and is then connected to the second output end, and the first output end is connected to an inverting input end of the first operational amplifier $A_1$; the second output end is connected to the ground; a connection node between the second resistor $R_2$ and the fourth capacitor $C_4$ is connected to an output end of the first operational amplifier $A_1$ through the second capacitor $C_2$, an inverting input end of the first operational amplifier $A_1$ is connected to the output end, and a forward input end of the first operational amplifier $A_1$ is connected to one of the output ends of the induction coil; the voltage measurement module is connected to the first output end.

By the impedance transformation circuit, a function of transforming a small resistance into an equivalent of a big resistance is realized, and the magnification is determined by a ratio of the second capacitor $C_2$ to the fourth capacitor $C_4$, such that a quality factor of the induction coil is lowered to a large extent, a bandwidth is greatly expanded, and all-band measurement is realized on the condition of no magnetic flux negative feedback.

It needs to explained that the first operational amplifier should have a sufficient bandwidth so as to achieve practically desired impedance transformation.

Specifically, the voltage measurement module comprises a differential amplifier $A_2$. The induced electromotive force generated by the induction coil is measured by the voltage measurement module.

Optionally, if the all-band magnetic sensor does not comprise the impedance transformation circuit, the forward input end and the inverting input end of the differential amplifier $A_2$ are respectively connected to two output ends of the induction coil; if the all-band magnetic sensor comprises the impedance transformation circuit, the forward input end of the differential amplifier is connected to the first output end, and the connection node between the second resistor $R_2$ and the fourth capacitor $C_4$ is connected to the inverting input end.

Specifically, the integrator comprises a third operational amplifier $A_3$, a first resistor $R_1$, and a third capacitor $C_3$; one end of the first resistor $R_1$ is connected to the voltage measurement module, another end of the first resistor is connected to a forward input end of the third operation amplifier, an inverting input end of the third operation amplifier is grounded, and the forward input end of the third operation amplifier is connected to an output end of the third operational amplifier through the third capacitor.

Since the integrator has characteristics of a big low frequency magnification and a small high frequency magnification, bandwidth expansion is then realized.

It needs to be explained that when selecting the third capacitor $C_3$, $C_3$ cannot increase without limit; it is required to consider its time of charging using the first operational amplifier $A_1$, and it is necessary to ensure that its charging rapid is fast enough and ensure that the measurement bandwidth is not affected.

Preferably, in order to obtain low noise and desired integrated values, the first resistor $R_1$ and the third capacitor $C_3$ in the integrator should be in correspondence with values of the second resistor $R_2$ and the fourth capacitor $C_4$ in the impedance transformation circuit, that is, the second resistor $R_2$ is identical to the first resistor $R_1$ of the integrator, and the fourth capacitor $C_4$ is identical to the third capacitor $C_3$ of the integrator.

Preferably, in order to improve performance of the present disclosure, 1/f noise of the operational amplifiers should be as small as possible. Additionally, effect of offset currents and offset voltages of the operational amplifiers on the first operational amplifier $A_1$, effect of the offset currents and the offset voltages on the integrator, and the like, should also be considered. The third operational amplifier $A_3$ is an operational amplifier with low noise performance.

Figure 2:
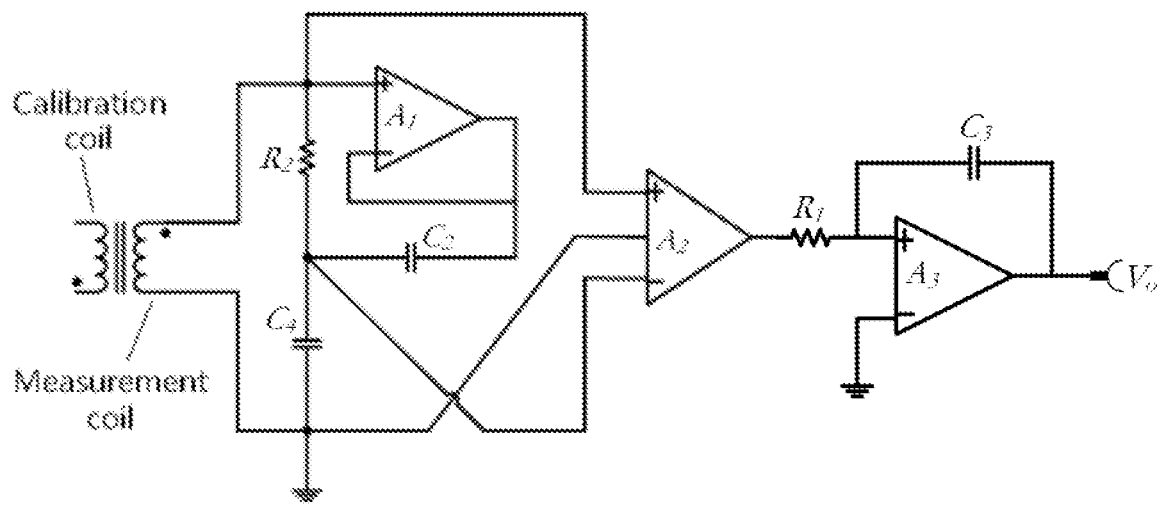
FIG. 2 is a circuitry structural view of an all-band magnetic sensor shown by an embodiment I of the present disclosure.

Since a bandwidth of the magnetic sensor is mainly determined by its quality factor, when the quality factor of the induction coil decreases, the measurement bandwidth increases. However, in order to decrease the quality factor of the induction coil, the loop resistance of the induction coil needs to be increased; when the loop resistance of the induction coil increases, its heat noise increases correspondingly. Since low frequency magnetic field signals are very weak, the loop resistance of the induction coil cannot be too big. In FIG. 2, the resistor $R_1$, $C_1$, and $C_2$ amplify the loop resistance of the induction coil through the first operational amplifier $A_1$, and realize a function of using a small resistance to obtain an equivalent transformation of a big resistance, such that an extremely low quality factor can be obtained on the premise of very small heat noise of the loop resistance of the induction coil, and a purpose that the measurement bandwidth of the induction coil is really extended to an ultralow frequency and an ultrahigh frequency is realized. Moreover, this is open-loop measurement, therefore power consumption of the sensor is extremely low. The measurement principle of the magnetic sensor shown in FIG. 2, that is, magnetic transformation relationship, is deduced below.

FIG. 3 is an equivalent measurement circuit of FIG. 2. As shown in FIG. 3, according to superposition principle, $V_m$ in the figure can be obtained:

$$Vm = V_i\left(\frac{1}{Z_1} + \frac{1}{Z_2}\right)\frac{1}{\frac{1}{Z_1} + \frac{1}{Z_2} + \frac{1}{Z_3}} \quad (2)$$

$$= V_i\left(1 - \frac{Z_1 Z_2}{Z_1 Z_2 + Z_2 Z_3 + Z_3 Z_1}\right)$$

wherein, $Z_1=R_1$, $Z_2=1/jwC_2$, $Z_3=1/jwC_3$. Assuming that $G=C_2/C_3$, thus it can be inferred that a voltage drop of Z1 is:

$$V_i - V_m = \frac{Z_1 Z_2 V_i}{Z_1 Z_2 + Z_2 Z_3 + Z_3 Z_1} \quad (3)$$

$$= V_i \frac{1}{1 + \frac{Z_3}{Z_1} + G}$$

Thus, the current passing through $Z_1$ is:

$$\frac{V_i - V_m}{Z_1} = \frac{Z_2 V_i}{Z_1 Z_2 + Z_2 Z_3 + Z_3 Z_1} \quad (4)$$

Thus, an equivalent input impedance is:

$$Z_i = \frac{V_i}{\frac{V_i - V_m}{Z_1}} = (1 + G)Z_1 + Z_3 \quad (5)$$

Since the induction coil is not desired, parameters of a leakage inductance $L_p$, a line resistance $R_p$, a distribution capacitance $C_p$, and an electromotive force of magnetic field induction e exist.

Thus, an equivalent impedance after $Z_i$ and $C_p$ are connected in parallel is:

$$Z_e = C_p \mathbin{/\mkern-5mu/} Z_i = \frac{1 + j\omega G R_1 C_3}{j\omega(C_3 + C_p + j\omega G R_1 C_3 C_p)} \quad (6)$$

$$\approx \frac{1 + j\omega G R_1 C_3}{j\omega C_3(1 + j\omega G R_1 C_p)}$$

Generally, $C_p$ is only hundreds of pF, $R_1$ is selected as 1 kΩ, assuming that $C_3 \gg C_p$, therefore effect of $C_p$ in the denominator usually can be ignored, and thus the equivalent impedance can be written as:

$$Z_e \approx \frac{1 + j\omega G R_1 C_3}{j\omega C_3} \quad (7)$$

That is, as long as the parameters are selected appropriately, effect of a parasitic capacitance of a coil can be ignored, and only an impedance transformer acts on input signals. Therefore, a signal on the forward input end of the first operational amplifier $A_1$ is:

$$V_i = \frac{Z_e}{j\omega L_p + R_p + Z_e} \cdot e = \frac{\frac{1 + j\omega GR_1C_3}{j\omega C_3}}{j\omega L_p + R_p + \frac{1 + j\omega GR_1C_3}{j\omega C_3}} \cdot e = \qquad (8)$$

$$\frac{1 + j\omega GR_1C_3}{j\omega C_3(j\omega L_p + R_p) + 1 + j\omega GR_1C_3} \cdot e =$$

$$\frac{1 + j\omega GR_1C_3}{1 + j\omega C_3(j\omega L_p + R_p + GR_1)} \cdot e \approx \frac{1 + j\omega GR_1C_3}{1 + j\omega C_3 GR_1 - \omega^2 L_p C_3} \cdot e$$

After the formula (8) is substituted into (3), if $A_2=1$, it can be obtained that a voltage at two ends of $R_1$ is:

$$V_{is} = V_i \frac{1}{G + \frac{1}{j\omega R_1 C_3}} \approx \frac{1 + j\omega GR_1C_3}{1 + j\omega C_3 GR_1 - \omega^2 L_p C_3} \cdot \frac{j\omega R_1 C_3}{1 + j\omega GR_1 C_3} \cdot e = \qquad (9)$$

$$\frac{j\omega R_1 C_3 \cdot e}{1 + j\omega C_3 GR_1 - \omega^2 L_p C_3}$$

Thus, an output voltage of the third operational amplifier $A_3$ is:

$$V_o = \frac{V_{is}}{j\omega R_1 C_3} = \frac{-e}{1 + j\omega C_3 GR_1 - \omega^2 L_p C_3} \qquad (10)$$

According to Faraday law of electromagnetic induction, there is:

$$e = -j\omega \mu_a N_p SAB \qquad (11)$$

Wherein, $\mu_a$ is an effective magnetic conductivity, S is an effective cross-sectional area of a magnetic path, $N_p$ is the number of turns of the induction coil, and B is a magnetic induction strength.

Thus, a magnetic field transformation coefficient is:

$$\frac{V_o}{B} = \frac{j\omega \mu_a N_p SA}{1 + j\omega C_3 GR_1 - \omega^2 L_p C_3} \qquad (12)$$

By adjusting a ratio of the capacitor $C_2$ to $C_3$, the value of G can be changed, so that different magnetic field transformation relationships are obtained.

Embodiment II

Embodiment II is an embodiment of performing a performance test for a magnetic sensor of the present disclosure.

Figure 4:
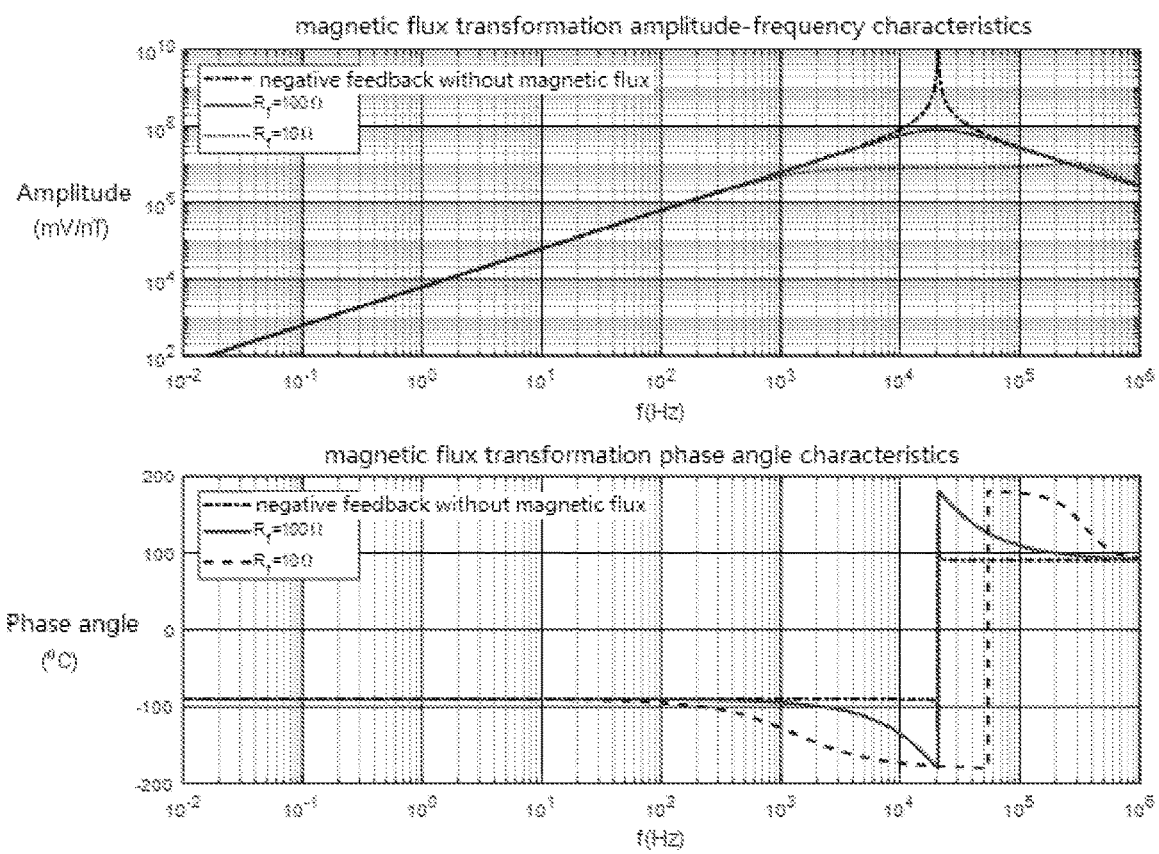
FIG. 4 is a schematic diagram of a transformation relationship of a measurement coil which has and hasn't feedback magnetic flux.

In a laboratory, there is a magnetic sensor of which a resonance frequency reaches 20 kHz, which can be applied in Controllable Source Audio Magnetotelluric Method (CSAMT) detection. A self-inductance of a measurement coil is 0.3459H, a parasitic capacitance is 170 pF, a resistance of the measurement coil is 1934Ω, an equivalent area of the coil is S=112.903 mm², the number of turns of the measurement coil is 10000 turns, a feedback resistance $R_f$=1 kΩ, the number of turns of a feedback coil is 35 turns, an effective magnetic conductivity is 705, a magnification is 1; thus, it can be known from the formula (1) that a transformation relationship of a measurement coil which has and hasn't feedback magnetic flux is as shown in FIG. 4.

It can be seen that along with decrease of the feedback resistance, a feedback depth increases, and a bandwidth is expanded. However, it is followed that power consumption also increases quickly, and the bandwidth expansion is limited, it is difficult to achieve all-band measurement.

Figure 5:
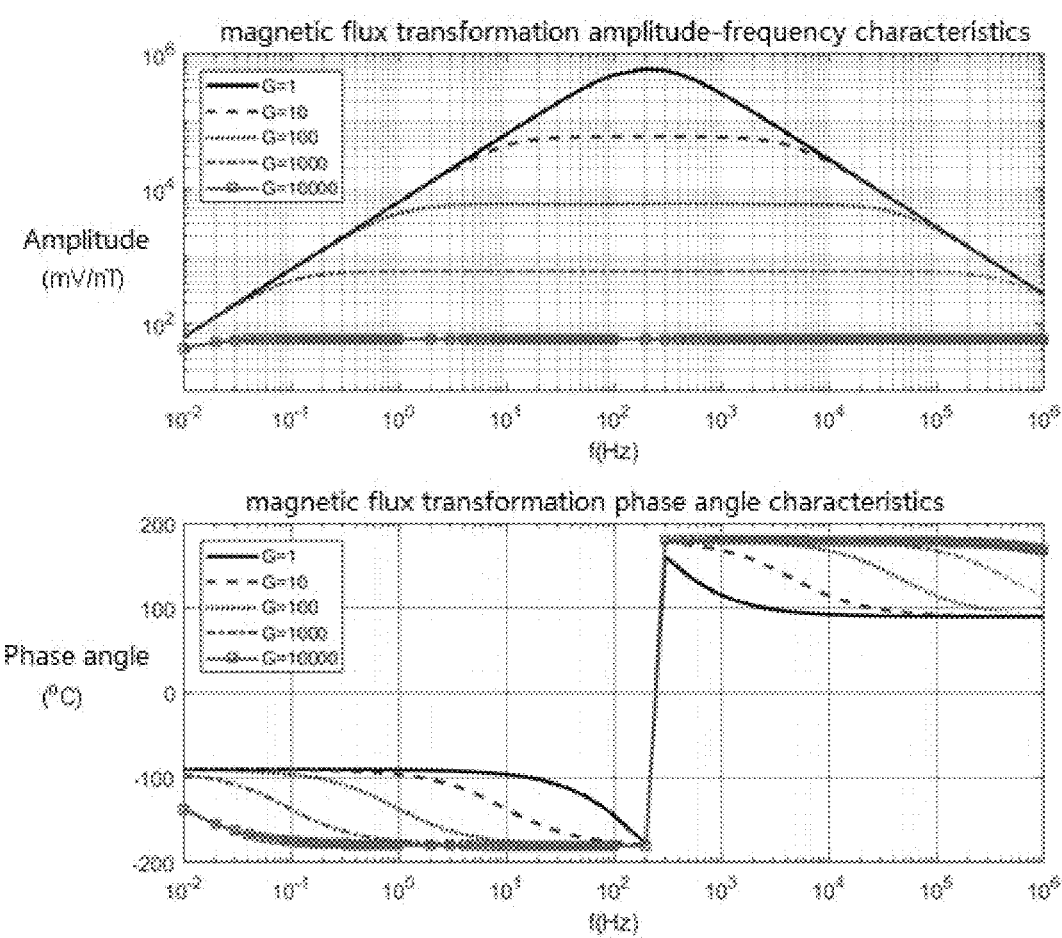
FIG. 5 is a schematic diagram of a transformation relationship of the magnetic sensor of which the circuit is shown in FIG. 2.

After adopting the method shown in FIG. 2 of the technology of the present disclosure, if $R_1$=1000Ω, $C_3$=47 nF, it is respectively selected that $C_2$=47 nF, 0.47 μF, 4.7 μF, 47 μF, 470 μF, and the corresponding G is respectively 1, 10, 100, 1000, 10000, a corresponding transformation relationship of the magnetic sensor is as shown in FIG. 5. This is only intended to illustrate features of the present disclosure, in actual designs, it is very difficult to realize G=10000. The larger G, the higher the performance requirement for the first operational amplifier $A_1$, the more sensible the noise, the higher the requirement for the capability of driving the operational amplifiers, the lower the requirement for the output resistance, and the higher the requirement for stability and accuracy of $C_2$, $C_3$. In conclusion, as long as it can be ensured that the first operational amplifier $A_1$ meets the above requirements, a magnetic transformation characteristic with an extremely wide measurement bandwidth can be obtained.

Additionally, the larger G, the smoother the corresponding phase transformation, and the easier to obtain a magnetic field with an ultralow frequency. Since the present disclosure has no magnetic flux negative feedback, there is no problem of self-excited oscillation; when a phase in the measurement frequency band exceeds 180°, the system still can measure stably.

The above described are only preferred embodiments of the present disclosure and are not intended to limit the present disclosure. Any modifications, equivalent replacements, and improvements made within the spirit and principle of the present disclosure should be all included in the protection scope of the present disclosure.

What is claimed is:

1. An all-band magnetic sensor, comprising:
   an induction coil configured to generate an induced electromotive force according to magnetic flux passing therethrough;
   a voltage measurement module electrically connected to the induction coil and configured to measure the induced electromotive force generated by the induction coil; and
   an integrator electrically connected to the voltage measurement module and configured to expand a bandwidth;
   wherein the integrator comprises a third operational amplifier, a first resistor, and a third capacitor; one end of the first resistor is connected to the voltage measurement module, another end of the first resistor is connected to a forward input end of the third operational amplifier, an inverting input end of the third operational amplifier is grounded, and the forward input end of the third operational amplifier is connected to an output end of the third operational amplifier through the third capacitor.

2. The all-band magnetic sensor according to claim 1, wherein, the voltage measurement module comprises a differential amplifier, a forward input end and an inverting input end of the differential amplifier are respectively connected to two output ends of the induction coil.

3. The all-band magnetic sensor according to claim 1, wherein, the third operational amplifier is an operational amplifier having a low-noise performance.

4. The all-band magnetic sensor according to claim 1, wherein, the all-band magnetic sensor further comprises an impedance transformation circuit, the impedance transformation circuit is connected to the output end of the induction coil and configured to improve a loop resistance of the induction coil.

5. The all-band magnetic sensor according to claim 4, wherein, the impedance transformation circuit comprises a second resistor, a second capacitor, a fourth capacitor, and a first operational amplifier; the induction coil comprises a first output end and a second output end, the first output end is connected in series with the fourth capacitor through the second resistor and is then connected to the second output end, and the first output end is connected to an inverting input end of the first operational amplifier; the second output end is connected to the ground; a connection node between the second resistor and the fourth capacitor is connected to an output end of the first operational amplifier through the second capacitor, an inverting input end of the first operational amplifier is connected to the output end, and a forward input end of the first operational amplifier is connected to one of the output ends of the induction coil; the voltage measurement module is connected to the first output end.

6. The all-band magnetic sensor according to claim 5, wherein, the differential amplifier of the voltage measurement module comprises a forward input end and an inverting input end, the forward input end of the differential amplifier is connected to the first output end, and the connection node between the second resistor and the fourth capacitor is connected to the inverting input end.

7. The all-band magnetic sensor according to claim 5, wherein, the second resistor is identical to the first resistor of the integrator, and the fourth capacitor is identical to the third capacitor of the integrator.

\* \* \* \* \*